United States Patent [19]

Misic et al.

[11] Patent Number: 5,517,120
[45] Date of Patent: May 14, 1996

[54] QUADRATURE COIL FOR NEUROVASCULAR IMAGING AND SPECTROSCOPY OF THE HUMAN ANATOMY

[75] Inventors: George J. Misic, Novelty, Ohio; William J. Monski, Pittsburgh; Eric Reid, Monroeville, both of Pa.

[73] Assignee: Medrad, Inc., Pittsburgh, Pa.

[21] Appl. No.: 158,052

[22] Filed: Nov. 24, 1993

[51] Int. Cl.⁶ .............................. G01V 3/00; A61B 5/055
[52] U.S. Cl. ..................... 324/318; 324/322; 128/653.2; 128/653.5
[58] Field of Search ................... 324/318, 322; 128/653.2–653.5

[56] References Cited

U.S. PATENT DOCUMENTS

| | | |
|---|---|---|
| 4,712,067 | 12/1987 | Roschmann .............................. 324/318 |
| 4,752,736 | 6/1988 | Arakawa et al. . |
| 4,816,765 | 3/1989 | Boskamp . |
| 5,221,902 | 6/1993 | Jones ....................... 324/318 |
| 5,361,765 | 11/1994 | Herlihy et al. .......................... 324/318 |
| 5,379,767 | 1/1995 | Derby .................................. 324/318 X |

Primary Examiner—Sandra L. O'Shea
Assistant Examiner—Mack Haynes
Attorney, Agent, or Firm—Keck, Mahin & Cate

[57] ABSTRACT

A quadrature coil with a unique arrangement of vertical and horizonal mode coils allows for superior magnetic resonance imaging and spectroscopy through higher sensitivity and more uniform imaging over the region from the head to the crest of the aortic arch. The coil has vertical-mode conductors at approximately 30°, 150°, 210°and 330°with respect to a longitudinal axis, and horizontal-mode conductors at 90°and 270°. The horizontal-mode conductors are connected at the far end of the coil at an electrical midpoint of the horizontal-mode conductors, such that a voltage null will exist there when the coil is operated in vertical mode. The vertical and horizontal mode feedpoints are located at a head end of the coil, which is hinged into halves to permit easy access by and to a patient.

30 Claims, 4 Drawing Sheets

QUADRATURE COIL FOR NEUROVASCULAR IMAGING AND SPECTROSCOPY OF THE HUMAN ANATOMY

FIELD OF INVENTION

This invention relates to a quadrature coil for neurovascular magnetic resonance imaging and/or spectroscopy. More specifically, this invention is a unique arrangement of vertical and horizonal mode coils which allow for superior imaging through higher sensitivity and more uniform imaging over the region from the head to the crest of the aortic arch.

BACKGROUND OF INVENTION

The use of nuclear magnetic resonance imaging (NMR) and spectroscopy of the human anatomy in the medical field has become increasingly widespread. Both procedures require the spacing of electrical conductors around the subject to be scanned. After inducing signals into these conductors, an image of the subject may be constructed electronically from the response of selected chemical bonds in the subject.

Present imaging systems include those which arrange the conductors in the form of a cylinder having a number of conductors located parallel to the axis of the cylinder. A subject conventionally is placed within the "birdcage" of conductors, and the conductors receive signals in order to obtain an image of the subject.

However, present imaging does not permit focusing on particular areas of interest on an anatomical subject. For example, an area of particular interest which requires higher sensitivity and more uniformity is the top of the head to the crest of the aortic arch. One of the problems with present magnetic resonance imaging and spectroscopy systems is the lack of uniformity of scanning this area. A further problem is the lack of accessibility for the subject due to the encompassing cylinder design.

Thus, a coil is needed which achieves higher sensitivity and uniformity in order to image the neurovascular structure and other organs over and in the volume of the body from the head to the crest of the aortic arch, and which permits easier access by the patient.

SUMMARY OF INVENTION

It is therefore an object of the present invention to achieve quadrature operation for magnetic resonance imaging applications within the coil geometry dictated by the subject's anatomy.

It is a further object of the present invention to achieve greater overall RF field uniformity for the coils sensing the head to aortic crest region of the body.

Another object of the invention is to allow a coil configuration to be used in a transmit/receive mode for allowing specialized magnetic resonance imaging applications.

Yet another object of the present invention is to allow improved access by and to the scanned subject by allowing cutout areas.

Still another object of the present invention is to achieve a better signal to noise ratio over the entire region of interest, including the subject anatomy in the cutout areas.

Still another object of the present invention is to create two independent RF fields which are orthogonal to each other in the same coil, while still allowing easy access by and to the NMR subject.

These and other objects may be realized in the present invention, which is a quadrature coil for magnetic resonance imaging and spectroscopy. The quadrature coil has first and second vertical mode loops. Each loop has a first end, a second end and an electrical midpoint. The first ends of the loops are joined together at a first vertical mode feedpoint while the second ends are joined together at a second vertical mode feedpoint. The quadrature coil also has first and second horizontal mode conductors. Each conductor has a first end and a second end. The first ends are joined to respective horizontal mode feedpoints while the second ends are joined to the respective ends of the midpoints.

A waveform generator is coupled to the vertical mode feedpoints and is operable, during a vertical mode of operation, to transmit a vertical mode electromagnetic waveform that is balanced with respect to common ground to the vertical mode feedpoints. The voltages thus appearing at the two feedpoints are of equal magnitude but opposite phases. The midpoints of the coil conductor experience voltage nulls as a result of the opposite-phase waveforms.

The waveform generator also is coupled to the horizontal mode feedpoints and is operable, during a horizontal mode of operation, to transmit a horizontal mode electromagnetic waveform that is balanced with respect to common ground to the horizontal mode feedpoints. As in the vertical mode of operation, the two horizontal mode voltages appearing at the two horizontal feedpoints are of equal magnitude and opposite phase. During the horizontal mode operation, the vertical mode feedpoints become electrical midpoints which experience voltage nulls.

According to another aspect of the invention, the coil has a pair of coil formations disposed in opposed relationship around a longitudinal axis. At least one of the coil formations has a barrel portion including first and second linear conductors parallel to the axis and disposed at a predetermined angle from a horizontal plane including the axis. An extension portion of the coil formation longitudinally extends from the barrel portion and includes a conductor which is bilaterally symmetrical with respect to a horizontal plane which joins the first and second linear conductors.

According to a further aspect of the invention, a hinged quadrature coil is provided for magnetic resonance imaging and spectroscopy. The coil includes a top coil formation which is hinged to a bottom coil formation. Each of the coil formations includes a conductor loop having first and second ends which are disposed near the hinged end of the coil formation. The feedpoints of the conductor loops are respectively disposed at the hinged ends of the coil formations.

According to a further aspect of the invention, a shortened version of the quadrature coil is provided for magnetic resonance imaging and spectroscopy. The coil includes the anatomical cutouts, but a shortend overall conductor length, thus allowing selective imaging of a portion of the anatomy anywhere along the region between the top of the aortic arch and the top of the head. The reduced imaging volume of this coil provides a relative improvement in signal to noise ratio.

In a preferred embodiment, each of the coil formations comprises a conductor loop having first and second arcuate segments near the first, or head, end; first and second parallel linear segments which are parallel to the longitudinal axis of the coil formation and to each other; first and second curved segments which are respectively joined to the far, or shoulder, ends of the linear segments; and a third linear segment that joins together the two curved segments and is disposed perpendicular to the longitudinal axis.

The coil achieves greater quadrature RF field uniformity over its entire length than can be done in a birdcage design. This allows the coil to be used in a transmit/receive (T/R) mode rather than just as a receive-only coil. The greater uniformity also allows the use of recently developed magnetization transfer protocols for specialized magnetic resonance imaging applications.

The layout and spacing of the conductors according to the illustrated embodiment of the invention allow cutout regions that improve visibility of the patient and access by and to him as compared with a birdcage configuration. There is also a better signal to noise ratio in the subject anatomy within the cutaway area.

All connections between the top and bottom halves of the coil are made at one end. This allows the entire assembly to be hinged for easy entrance and egress by the patient. Preferably, the connections at the hinged end are flexible such that electrical contact never has to be broken in order to allow patient entry to and exit from the coil. The present invention may also be applied to multi-coil array configurations.

BRIEF DESCRIPTION OF THE DRAWINGS

The present invention may be better understood with reference to the detailed description in conjunction with the following figures where like numerals denote identical elements.

DETAILED DESCRIPTION OF THE PREFERRED EMBODIMENT

Figure 1:
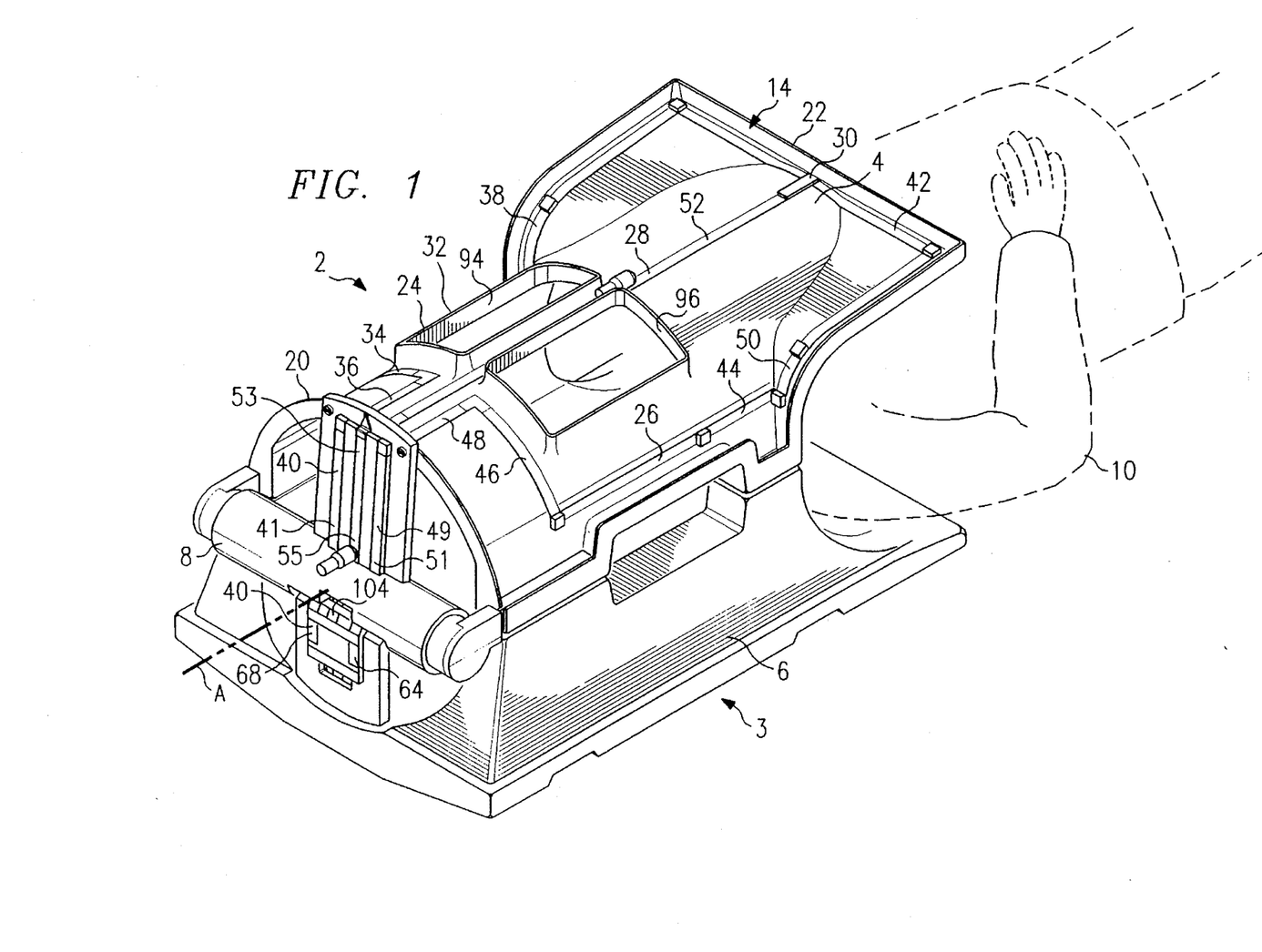
FIG. 1 is a perspective view of a coil formation according to one embodiment of the present invention with coil formation halves in a closed position.
Figure 2:
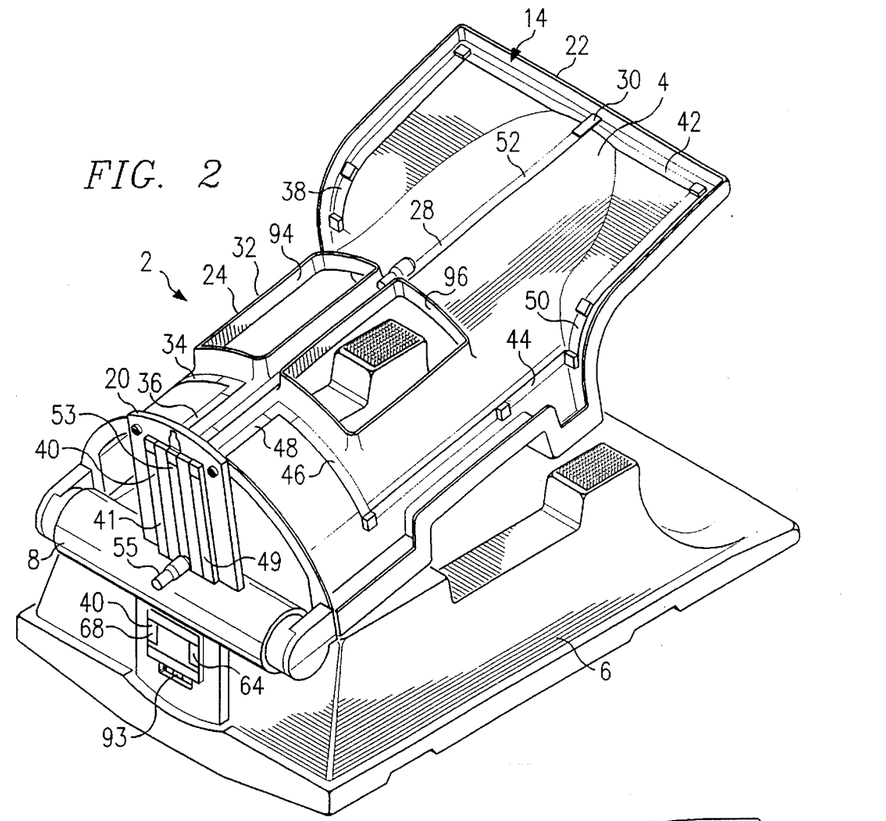
FIG. 2 is a perspective view of the embodiment shown in FIG. 1, with the coil formation halves in an open position.

FIGS. 1 and 2 are perspective views of a quadrature coil indicated generally at 2. Quadrature coil 2 is used for magnetic resonance imaging and spectroscopy. The quadrature coil 2 is built on an electrically insulative shell 3, which in the illustrated embodiment includes an upper shell half 4 and a lower shell half 6. The upper shell 4 and the lower shell 6 are connected by a hinge 8 to allow for easy opening and closing. FIG. 2 shows the coil 2 in an open position, while FIG. 1 shows the coil 2 in a closed position. A patient 10 who is to be scanned is placed between the upper and lower shells 4 and 6. As may be seen in FIGS. 1, 2 and 3, quadrature coil 2 allows imaging over an entire region consisting of the head, neck and upper region of the chest to about the top of the aortic arch. Other embodiments of the invention can be sized for different body parts or portions, or even nonhuman subjects.

Figure 3:
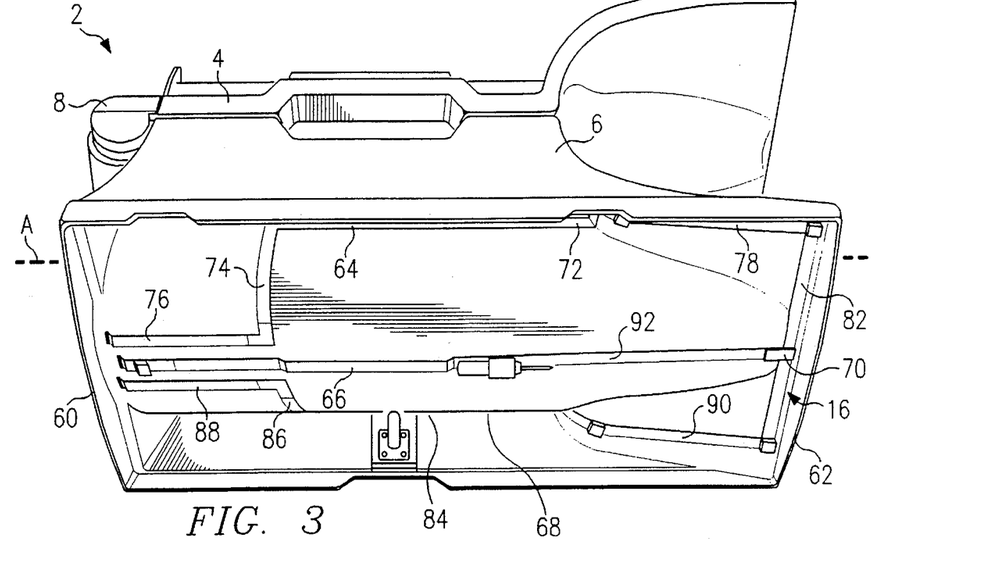
FIG. 3 is a bottom perspective view of the present invention.

The coil geometry consists of six essentially parallel conductors 24, 26, 28, 64, 66 and 68 (these last three are best shown in FIG. 3) positioned about the circumference of the quadrature coil 2. These conductors are divided between the upper and lower shells 4 and 6. A top coil formation 14 is disposed on the upper shell 4. Similarly a bottom coil formation 16 is disposed on the bottom shell 6.

FIGS. 1 and 2 show the top coil formation 14 has a near or head end 20 which is colocated with the hinge 8 and an opposed far or shoulder end 22. The top coil formation 14 has three conductors 24, 26, and 28 which are electrically connected to each other at an electrical midpoint 30 located on the far end 22 of the top coil formation 14.

The vertical-mode conductor 24 has a first linear segment 32 which is disposed parallel to a longitudinal axis A of the cylinder formed by the upper and lower shells 4 and 6 in their closed condition. The first linear segment 32 is located on the circumference of the cylinder formed by the upper and lower shells 4 and 6 at about 150 degrees, or 30 degrees above a horizontal plane including axis A. The first linear segment 32 is connected to a first arcuate segment 34 which is disposed on the upper shell 4 so as to connect first linear segment 32 to a connecting segment 36 on the near end 20. In the illustrated embodiment, arcuate segment 34 is disposed in an arc which extends through close to sixty degrees of arc and which is in a plane perpendicular to the longitudinal axis A of coil 2. Connecting segment 36 is electrically connected to a vertical strap or conductor 40 located at the near end 20. A vertical feedpoint 41 is located on vertical head end segment 40 near hinge 8.

The other end of first linear segment 32 is connected to a first curved shoulder segment 38 which follows the contour of the upper shell 4 at the far end 22. As shown in FIGS. 1 and 2, the contour may conform to a cylindrical curved surface having an axis which is horizontal and perpendicular to the axis A of coil 2. Curved segment 38 preferably resides in a vertical plane which is parallel to axis A. The curved segment 38 is connected to one end of a cross connecting conductor 42. Connecting conductor 42 is preferably straight, horizontal and perpendicular to axis A. The midpoint of cross connector 42 is the same as the electrical midpoint 30, which joins vertical-mode conductor 24 electrically with vertical-mode conductor 26 and horizontal-mode conductor 28.

As depicted in FIGS. 1 and 2, and in mirror image to conductor 24, conductor 26 has a main linear segment 44 which is disposed parallel to the axis A of the cylinder formed by the upper and lower shells 4 and 6. The linear segment 44 is located on the circumference of the cylinder formed by the upper and lower shells 4 and 6 at about 30 degrees from the horizontal plane. The linear segment 44 is connected to an arcuate segment 46 which is disposed on the upper shell so as to connect linear segment 44 to a connecting segment 48 adjacent the near end 20 near the 90° position. Connecting segment 48 is electrically connected to a vertical conductor head end segment 49 which is located near the vertical plane of the cylinder formed by the upper and lower shells 4 and 6. A vertical feedpoint 51 is positioned on conductor 49 near hinge 8. Feedpoints 41 and 51 may be considered to be opposed ends, of a loop formed by the 150° vertical mode conductor 24 and the 30° vertical mode conductor 26. Feedpoints 41 and 51 also act as the opposed ends of a loop formed by a 210° vertical mode conductor 68 and a 330° vertical mode conductor 64 (described below). Feedpoints 41 and 51 are intentionally located at or near hinge 8 to prevent interference with the entry into or exit from the apparatus 2 by patient 10 and to maintain electrical symmetry of the feedpoint locations.

FIGS. 1 and 2 also show the other end of linear segment 44 is connected to a curved shoulder segment 50 which follows the transverse cylindrical contour of the upper shell 4 at its far end 22. Preferably, arcuate segment 50 is disposed in a vertical plane which is parallel to axis A. The curved segment 50 is connected to the second end of the linear cross connector segment 42. The midpoint of cross connector 42 is the balanced midpoint 30 which joins conductor 26 electrically with conductors 24 and 28.

Of FIGS. 1 and 2 has a linear segment 52 which extends longitudinally across the upper shell 4 at a 90° position from the far end 22 to the near end 20 of the top coil formation 14. At near end 20, the linear segment 52 of the conductor 28 is joined electrically to a vertically positioned conductor segment 53 which includes a horizontal feedpoint 55. Conductor segment 53 runs from the circumference of the quadrature coil 2 to a point near axis A. The other end of third linear segment 52 is attached to contact point 30 which joins conductor 28 electrically with conductors 24 and 26. In a preferred embodiment, the altitude or vertical offset of the conductor segment 52 from the longitudinal axis A is the same as that of the cross-connecting shoulder end segment 42. Horizontal feedpoints 55 and 104 (this last being supplied for a horizontal mode conductor at the 270° position, described below) are preferably located at the ends of the vertical conductor segments 53 and 93 to which they are attached. The feedpoints 55 and 104 are preferably disposed at or near the hinge 8 to provide the minimum of interference when the shell 3 is articulated between open and closed positions to permit the entry or exit of a patient 10, and to maintian electrical symmetry.

Preferably, the top coil formation 14 is bilaterally symmetrical about the vertical plane including axis A. Likewise, the bottom coil formation 16 (FIG. 3) is bilaterally symmetrical about the vertical plane containing axis A. If departures from physical bilateral symmetry are made, adjustments should also be made such that the left and fight halves are electromagnetically in mirror image. Further, it is preferred that the top and bottom coil formations be mirror images of each other around the horizontal plane including axis A.

With particular reference to FIG. 3, three conductors are mounted on the bottom shell 6 in an arrangement similar to, and preferably in mirror image of, the conductors on the top shell 4 (FIGS. 1 and 2). The bottom coil formation 16 has a near, or head, end 60 which is below the hinge 8, and a far or shoulder end 62 opposed to hinge 8. The bottom coil formation 16 has three conductors 64, 66, and 68 which are electrically connected to each other at a balanced midpoint or contact point 70 located on the far end 62 of the bottom coil formation 16.

The conductor 64 of FIG. 3 has a first linear segment 72 which is disposed parallel to the axis A. The first linear segment 72 is located on the circumference of the cylinder formed by the upper and lower shells 4 and 6 at about the 330 degree position, or 30 degrees below the horizontal plane. The first linear segment 72 is connected to a first arcuate segment 74 which preferably resides in a plane perpendicular to axis A and subtends an angle from approximately 270° to 330°, so as to connect first linear segment 72 to a connecting segment 76 near the 270° position on the near end 60. Connecting segment 76 is connected to the vertically positioned conductor 49, which spans the diameter of the near ends 60 and 20. For this reason, connecting segment 49 is flexible, hinged or articulated so as to bend with hinge 8.

The other end of first linear segment 72 shown in FIG. 3 is connected to a first curved shoulder segment 78 which follows the preferably transverse cylindrical contour taken by the lower shell 6 at the far end 62. The first curved segment 78 preferably resides in a vertical plane which is parallel to axis A, and is connected to one end of a cross connecting segment 82. Cross connecting segment 82 is preferably straight and lies in a horizontal plane which is parallel to axis A. The electrical midpoint of segment 82 is joined to the contact point 70, which therefore joins conductor 64 electrically with conductors 66 and 68.

Similar to conductor 64, conductor 68 has a linear segment 84 (see FIGS. 4–6) which is disposed parallel to the axial center of the cylinder formed by the upper and lower shells 4 and 6. The linear segment 84 is located on the circumference of the cylinder formed by the upper and lower shells 4 and 6 at about 210 degrees, or 30 degrees below the horizontal plane including axis A. The linear segment 84 is connected to an arcuate segment 86 which is disposed on the lower shell 6 so as to connect linear segment 84 to an axially aligned connecting segment 88 on the near end 60. Preferably, arcuate segment 86 is disposed in a plane perpendicular to axis A and extends through an arc between about 270 degrees and 210 degrees. Connecting segment 88, which preferably is straight, axially aligned and resides near 270°, is electrically connected to the vertically positioned conductor 40. Vertically positioned conductor 40 spans the cylinder formed by shells 4 and 6, and should therefore either be flexible or articulated so as to bend with hinge 8. The other end of linear segment 84 is connected to a second curved shoulder segment 90 which follows the preferably transverse cylindrical contour (where "cylindrical" is used in its broad, mathematical sense) of the lower shell 4 at far end 62. FIG. 3 shows the arcuate segment 90 preferably resides in a plane which is vertical and parallel to axis A. The curved segment 90 is connected to one end of the cross connecting segment 82. The midpoint of cross connecting segment 82 is joined to the contact point or midpoint 70 which joins conductor 66 electrically to conductors 64 and 68.

As depicted in FIG. 3 conductor 66 has a linear segment 92 which extends longitudinally across the lower shell 6 from the far end 62 to the near end 60 of the bottom coil formation 16. Linear segment 92 is parallel to axis A and is disposed at the 270 degree position. The linear segment 92 of the conductor 66 is electrically connected to a vertically positioned conductor segment 93 (see FIGS. 2 and 4) near the axial center of the cylinder formed by upper and lower shells 4 and 6. The other end of linear segment 92 is attached to electrical midpoint or contact point 70 which joins conductor 68 electrically with conductors 64 and 66.

Referring back to FIGS. 1 and 2, the arrangement of the conductors allows access to the patient through access ports 94 and 96 which are installed on the top of the top shell 4. One of the access ports 94 is disposed between horizontal mode conductor 28 and the 150° vertical mode conductor 24. A second access port 96 is formed between the top horizontal mode conductor 28 and the 30° vertical mode conductor 26. The large access ports 94 and 96 could not be formed in prior art birdcage formations, and thus the invention presents a technical advantage in this respect.

The absence of conductors in the region of the subject's shoulders allows access by the subject to the sensitive volume of the coil defined by the volume generally identified by conductors 24, 26, 28, 64, 66, 68, 42, 82, 34, 46, 74, and 86. This access could not be accomplished with limited diameter prior art birdcage formations, and thus the invention presents a technical advantage in this respect.

Figure 4:
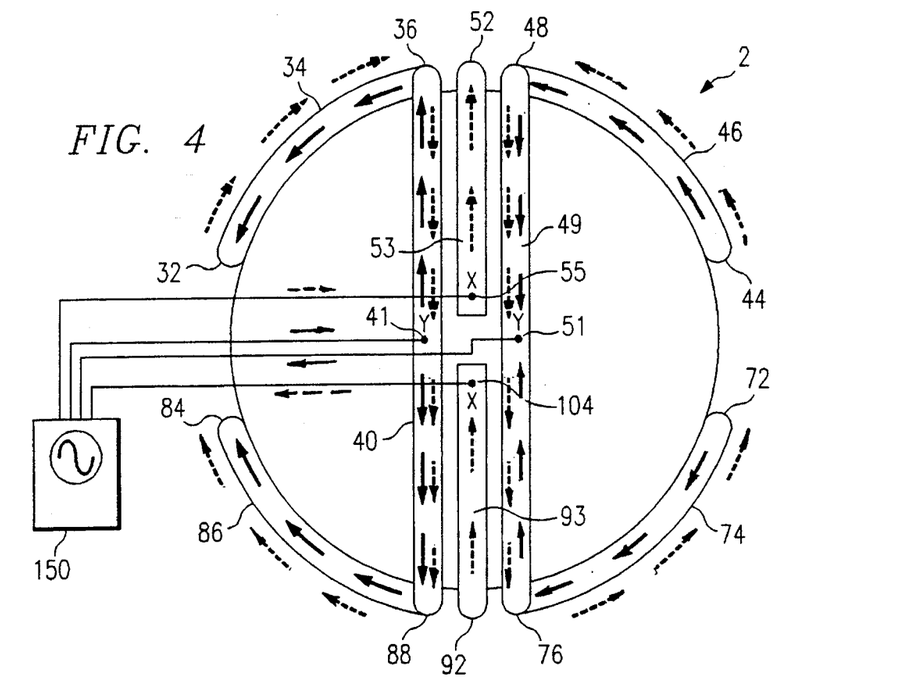
FIG. 4 is a schematic end view showing the conductor and feedpoint configuration of the present invention, and showing connections to a waveform generator.
Figure 5:
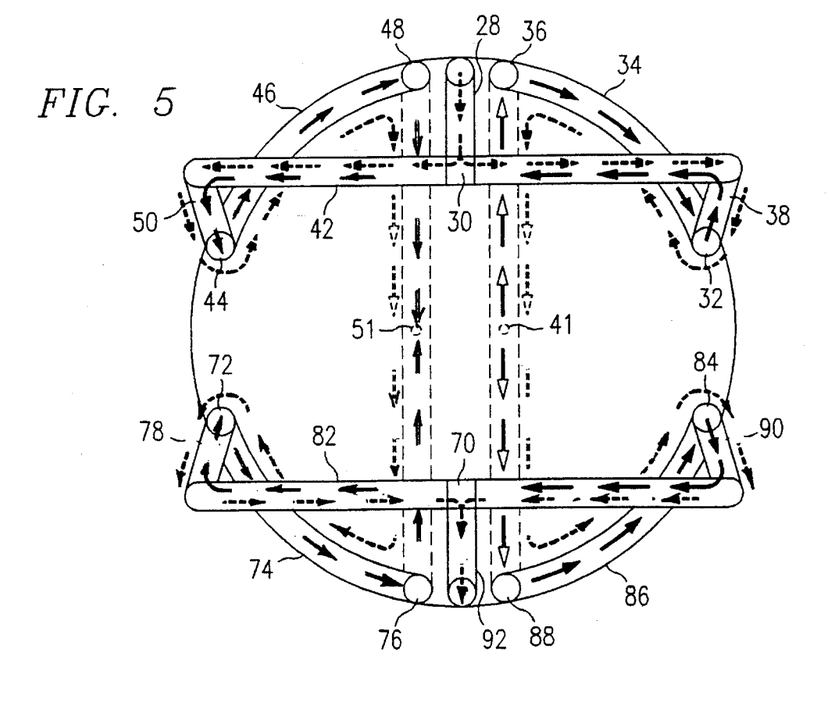
FIG. 5 is a schematic opposite end view showing the conductor and feedpoint configuration of the present invention.
Figure 6:
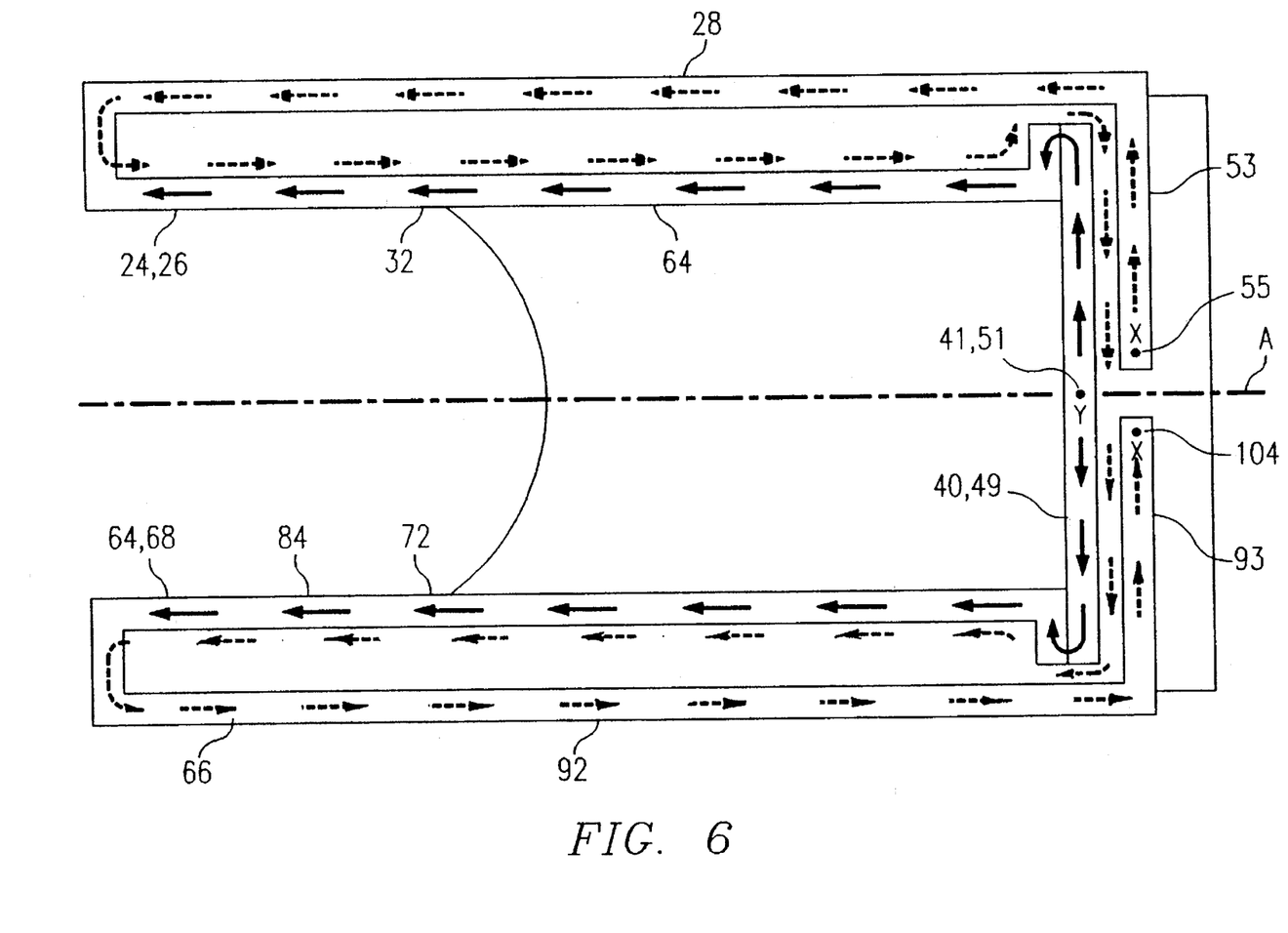
FIG. 6 is a schematic side view of the conductor and feedpoint configuration of the present invention.

The arrangement of the four conductors 24, 26, 64, and 68 form a saddle geometry creating a vertical RF field which is shown in FIG. 4, which is a schematic and elevational view from the head end, FIG. 5, which is a shoulder end view, and FIG. 6, which is a schematic side elevational view. The arrangement of the six conductors 26, 24, 28, 66, 64, and 68 form a second geometry creating a horizontal RF field. In FIG. 6, conductor 24 is superimposed on conductor 26, conductor 64 is superimposed on conductor 68, and conductor segment 40 is superimposed on conductor segment 49. The lines indicated at 24, 26; 64, 68; and 40, 49 therefore each represent each of a pair of conductors. In FIG. 5, the transverse conductor segments 42 and 82 are shown closer to the axis than they are, so that structure behind them can be shown. Segments 42 and 82 are preferably actually at the same height and depth as horizontal-mode conductor segments 52 and 92, respectively.

Capacitors are located in series with various segements of the conductors in a plurality of locations to resonate each of the horizontal and vertical modes of the resulting structure at the desired operating frequency. Capacitors are located in shunt across the feedpoint locations, one from vertical mode feedpoint 41 to 51, and one from horizontal mode feedpoint 55 to 104 to complete the resonance path, and to match the coil to the desired operating impedance.

A waveform generator 150 as shown in FIG. 4, is electrically connected to vertical feedpoints 41 and 51 and horizontal feedpoints 55 and 104. The waveform generator 150 generates waveforms used in the horizontal and vertical modes of operation of the coil, and are described below.

The conductors 24, 26, 64 and 68 are used as a vertical mode coil. With reference to FIGS. 4–6, the solid arrows represent current which produces a vertical RF field when the vertical mode is selected. With reference to FIGS. 1–6, a waveform is generated from waveform generator 150 which sends a waveform of a preselected magnitude to vertical feedpoints 41 and 51. The waveform generator 150 supplies voltages of equal amplitude and opposite phase to the two feedpoints with reference to common ground. The current from the waveform flows from right feedpoint 51 through connector 48, through arcuate segment 46, through linear segment 44, through curved shoulder segment 50, through shoulder end segment 42, through curved shoulder segment 38, through linear segment 32, through arcuate segment 34, through linear segment 36, and down conductor 40 back to feedpoint 41 to complete the circuit.

An identical current flow occurs with bottom coil formation 16. As is true for the top coil, the opposite voltage waveforms at the ends of conductors 64 and 68 are 180 degrees out of phase and result in a voltage null at midpoint 70. The two vertical mode coils thus produce a vertical RF field.

The present invention also completes a coil for a horizontal mode field over the entire volume of interest which produces an essentially uniform intensity over the volume. The horizontal mode coil is formed by conductors 66 and 28 in combination with all of the vertical mode coil conductors 24, 26, 64 and 68. With reference to FIGS. 4–6, the dashed arrows represent current which produces a horizontal RF field when the horizontal mode is selected. With reference to FIGS. 1–6, the horizontal mode is activated by the waveform generator 150 sending a voltage waveform of a predetermined magnitude and phase to horizontal feedpoints 55 and 104; the voltages at the feedpoints are of equal magnitude and opposite phase with respect to common ground, thus driving the feedpoints in a balanced manner. The magnitude of the horizontal mode waveforms can be the same or different from the magnitude of the vertical mode waveforms. The phase of the horizontal mode waveforms is generally shifted by +or −90° with respect to the vertical mode waveforms. The current from this waveform flows from horizontal feedpoint 55 through vertical conductor segment 53 to conductor 28. The current then divides at contact point 30, with one branch flowing through upper fight conductor segments 50, 44, 46, 48, 49, 76, 74, 72, 78 and joining the second branch at 70, and closing the circuit through conductor 66 and 93 back to the second horizontal feedpoint 104. The other branched current path includes conductor segments 38, 32, 34, 36, 40, 88, 86, 84, and 90, rejoining the first branch at 70. The zero voltage points due to the symmetry of the drive of the horizontal mode occur at vertical mode, as shown in FIG. 1, which results in voltage nulls at these points. The horizontal mode coil produces an RF field which is orthogonal to the RF field produced by the vertical mode coil described above.

Due to the balanced nature of the quadrature coil 2, conductor 28 at contact point 30; of FIG. 1 which is also joined to conductor end segment 42, is a zero voltage point during the operation of the saddle coil forming the vertical field mode. Similarly, contact point 70 at the junction of conductor segments 82 and 92, as shown in FIG. 3, is another zero voltage point during the operation of the saddle coil. The points 30 and 70 are at the exact electrical midpoints of the vertical mode path of the coil. The coil is driven in a balanced mode which results in a voltage null at each of the midpoints with respect to ground. Since the 90° conductor 28 and the 170° conductor 68 are placed at the zero voltage points in the vertical coil mode, no current flows in them due to the vertical coil mode voltage distribution. Nonetheless, the conductors 28 and 66 are available for use in a horizontal coil mode, producing a horizontally polarized field over the entire sensitive volume.

The conductors 28 and 66 form a current path which causes in-phase currents to flow in conductors 24 and 26 and equal currents of the opposite direction to flow in the conductors 64 and 68. The center points of the balanced transmission line for the vertical mode saddle coil are at the exact electrical center of the horizontal mode of the coil, thus there is no voltage occurring at these points from the horizontal mode operation of the coil and no currents will flow in or out of these nodes due to the horizontal mode.

The six conductors 24, 26, 28, 64, 66, and 68, shown in FIGS. 1–3 will generate a net horizontally polarized field over the entire sensitive volume of the coil. The resulting field will be essentially uniform over the entire volume. The quadrature nature of the two modes of the coil is retained with good fidelity over the desired sensitive region of the coil resulting in highly uniform quadrature operation over the nearly the entirety of the coil volume. This permits operation in a transmit/receive (T/R) mode.

The above description details the transmit mode operation of the coil, as it is based upon applied RF voltages and the resulting currents producing a time varing magnetic field. From the theory of receprocity, it is clear that reception of a circularly polarized oscillating magnetic field can be achieved in a reciprocal manner, with the resulting voltage and current outputs appearing at the respective feedpoints. From this point, conventional quadrature or multi-coil interfaces and data acquisition schemes can be used, and may be considered to be incorporated in generator/receiver 150 (FIG. 4).

The aforementioned description is not to be interpreted to exclude other coil arrangements advantageously employing the present invention. The above described quadrature coil is merely an illustrative embodiment of the principles of this invention. Other arrangements and advantages may be devised by those skilled in the art without departing from the spirit and scope of the invention. Accordingly, the invention should not be deemed to be limited to the above detailed description but only by the spirit and scope of the claims which follow.

What is claimed is:

1. A quadrature coil NMR system, comprising:

a continuous conductor including
first and second vertical mode loops each having a first end, a second end and an electrical midpoint, said first ends of said first and second loops joined together at a first vertical mode feedpoint, said second ends of said first and second loops joined together at a second vertical mode feedpoint; and
first and second horizontal mode conductor elements each having a first end and a second end, said first ends of said horizontal mode conductor elements joined to respective horizontal mode feedpoints, said second ends of said horizontal mode conductor elements joined to respective midpoints of the vertical mode loops;

a waveform generator coupled to said vertical mode feedpoints and operable, during a vertical mode of operation, to transmit a vertical mode electromagnetic waveform of a first predetermined magnitude and phase to said vertical mode feedpoints, driving the feedpoints with voltages of equal amplitudes and opposite phases with respect to common ground, such that said midpoints experience voltage nulls; and said waveform generator coupled to said horizontal mode feedpoints and operable, during a horizontal mode of operation, to transmit a horizontal mode electromagnetic waveform of a second predetermined magnitude and phase to said horizontal mode feedpoints, driving the feedpoints with voltages of equal amplitudes and opposite phases with respect to common ground, such that said vertical mode feedpoints are electrical midpoints which experience voltage nulls during said horizontal mode of operation of said system.

2. The system of claim 1, wherein said first predetermined magnitude is equal to said second predetermined magnitude, and said first phase is offset by + or −90° from said second phase.

3. The system of claim 1, further comprising a top shell and a bottom shell each having a first end, wherein said first vertical mode loop and said first horizontal mode conductor element are disposed on said top shell, said second vertical mode loop and said second horizontal mode conductor element are disposed on said bottom shell, said first ends of said top and bottom shells are hinged together, and said vertical and horizontal mode feedpoints are disposed at said first ends of said shells.

4. A method of performing quadrature NMR imaging on a subject, comprising the steps of:

providing an NMR coil system including a continuous conductor having first and second vertical mode conductor loops each having first and second ends and including first and second horizontal mode conductor elements each having first and second ends;

joining the first ends of said first and second horizontal mode conductor elements to respective horizontal mode feedpoints;

joining the second ends of said first and second horizontal mode conductor elements to electrical midpoints of said respective vertical mode conductor loops;

during a vertical mode of operation, transmitting a first electromagnetic waveform having a predetermined magnitude and phase to the first ends of said vertical mode conductor loops in a manner balanced to common ground;

responsive to said steps of transmitting said first and second electromagnetic waveforms, forming voltage nulls at said midpoints;

during a horizontal mode of operation, transmitting a second electromagnetic waveform having a second predetermined magnitude and phase to the first ends of the horizontal mode conductor elements in a balanced manner with respect to common ground; and responsive to said steps of transmitting said third electromagnetic waveform, forming voltage nulls at said first ends of said vertical mode conductor loops.

5. The method of claim 4, and further comprising the steps of:

disposing said first ends of said vertical mode conductor loops and said first ends of said horizontal mode conductor elements at a predetermined end of said coil system;

hinging an upper half of said coil system to a lower half of said coil system at said predetermined end;

opening said upper half with respect to said lower half around said hinge to admit the subject; and closing the upper half with respect to said lower half around at least a portion of the subject, said steps of opening and closing taking place without disconnecting the coil system from means for generating the electromagnetic waveforms.

6. A nuclear magnetic resonance quadrature coil operable in both vertical and horizontal modes and permitting enhanced access to a patient, the quadrature coil comprising:

a shell having first and second ends, and top and bottom halves disposed between said first and second ends, said shell encasing a volume of a portion of the patient's anatomy, wherein each half includes left and right quarters;

a continuous conductor including
a vertical mode coil having conductor elements disposed respectively on said top left quarter, said top right quarter, said bottom right quarter and said bottom left quarter, each conductor element extending from said first end to said second end of said shell, and vertical mode feedpoints respectively connected to each of said conductor elements at said first end; and
a horizontal mode coil having a top conductor element disposed on said top half of said shell and a bottom conductor element disposed on said bottom half of said shell, said top and bottom conductor elements extending from said first end to said second end of said shell, and horizontal feedpoints connected to the last said top and bottom conductor elements at said first end; wherein
said top conductor element of said horizontal mode coil and said top left and top right conductor elements of said vertical mode coil are joined at said second end, and said bottom conductor element of said horizontal mode coil and said bottom left and bottom right conductor elements of said vertical mode coil are joined at said second end.

7. A hinged quadrature coil for magnetic resonance imaging and spectroscopy, comprising:

a continuous conductor including a top coil formation and a bottom coil formation each having first and second ends, said first end of said top coil formation hinged to said first end of said bottom coil formation and said coil formations operable between closed and open positions with respect to each other, said top and bottom coil formations disposed around a longitudinal axis when said top and bottom coil formations are in said closed position;

each of said coil formations further comprising a conductor loop having a first and second end, said conductor loop first ends being disposed near the hinged end of each of said coil formations, said conductor loop extending from said first end to said second end of its respective coil formation; and feedpoints of said conductor loops of said coil formations respectively disposed at said first ends thereof.

8. The hinged quadrature coil of claim 7, wherein said first ends of said conductor loop of said top coil formation are joined to said first ends of said conductor loop of said bottom coil formation, junctions between said respective ends being flexible to permit articulation of said top coil formation in relation to said bottom coil formation without breaking the conductive paths between said respective ends.

9. The quadrature coil of claim 8 wherein said feedpoints are vertical mode feedpoints.

10. A quadrature coil for magnetic resonance imaging and spectroscopy comprising:

a continuous conductor including a first and a second coil formation each having a near end and a far end longitudinally opposed to said respective near end, said first and second coil formations formed around a longitudinal axis;

each of said coil formations further comprising the following electrically connected conductor segments:

first and second arcuate segments formed around said axis through predetermined arcs and disposed near said near end;

first and second linear segments having first ends joined to ends of said respective first and second arcuate segments, said first and second linear segments aligned with said longitudinal axis and extending from respective ones of said first ends to respective second ends;

first and second curved segments having first ends joined to second ends of said respective first and second linear segments; and a third linear segment disposed at said far end of said coil formation and perpendicular to said axis, opposed ends of said third linear segment connected to second ends of said respective curved segments.

11. The quadrature coil of claim 10, wherein said predetermined arcs are each sixty degrees in extent.

12. The quadrature coil of claim 10, wherein said arcuate segments are formed in a plane perpendicular to said axis.

13. The quadrature coil of claim 10, wherein said curved segments are formed in planes parallel to said axis and each other.

14. The quadrature coil of claim 10, wherein said first and second linear segments of said first and second coil formations respectively occupy positions at 30°, 150°, 210° and 330° with respect to said axis.

15. The quadrature coil of claim 10, wherein said coil achieves sufficient horizontal and vertical uniformity over substantially the entire length thereof that said coil may be used in a transmit/receive mode.

16. The quadrature coil of claim 10, further comprising:

a first vertical feedpoint disposed at said near ends of said coil formations and electrically connected to said first arcuate segments of said first and second coil formations; and a second vertical feedpoint disposed at said near ends of said coil formations and electrically connected to said second arcuate segments of said first and second coil formations.

17. The quadrature coil of claim 10, and further comprising a horizontal feedpoint disposed at said near end and electrically connected to a midpoint of said third linear segment of said first coil formation, a second horizontal feedpoint disposed at said near end and electrically connected to a midpoint of said third linear segment of said second coil formation.

18. The quadrature coil of claim 17, wherein each coil formation includes a horizontal mode conductor element connected between said horizontal feedpoint thereof and said midpoint of said third linear segment, a linear segment of said horizontal mode conductor element disposed in parallel to said axis and displaced away from said axis by a predetermined distance, said third linear segment displaced from said axis by said predetermined distance.

19. A quadrature coil for magnetic resonance imaging and spectroscopy comprising:

a continuous conductor including a pair of coil formations disposed in opposed relationship around a longitudinal axis, at least one coil formation including:

a barrel portion including first and second linear conductor elements parallel to said axis and each disposed at respective predetermined angles from a horizontal plane including said axis; and an extension portion longitudinally extending from said barrel portion and including a conductor element disposed to be bisected by a vertical plane including said axis, and electrically coupling said first and second linear conductor elements.

20. The quadrature coil of claim 19, wherein said extension portion is formed on a cylindrical surface having an axis orthogonal to said longitudinal axis.

21. A quadrature coil for nuclear magnetic resonance imaging, comprising:

a shell formed about a longitudinal axis for supporting a continuous conductor, and said shell having first and second opposed ends, said second end being open and said shell dimensioned so as to permit the introduction of an imaging subject along said longitudinal axis;

said continuous conductor including a first pair of vertical mode conductor elements disposed on said shell and extending from said first end of said shell to said second end, said conductor elements formed to be bilaterally symmetrical about a vertical plane including said axis, said conductor elements joined near said second end of said shell at a first electrical midpoint;

a second pair of vertical mode conductor elements disposed on said shell and extending from said first end to said second end, said second pair of vertical mode conductor elements formed to be bilaterally symmetrical about said vertical plane, each of said second pair of vertical mode conductor elements coupled to a respective one of said first pair of vertical mode conductor elements at said first end of said shell, said second pair of vertical mode conductor elements joined to each other at said second end at a second electrical midpoint;

a first horizontal mode conductor element disposed on said shell substantially within said vertical plane and extending from said first end to said second end, said first horizontal mode conductor element joined to said first pair of vertical mode conductor elements at said first electrical midpoint; and a second horizontal mode conductor element disposed on said shell substantially within said vertical plane and extending from said first end to said second end, said second horizontal mode conductor element joined to said second pair of vertical mode conductor elements at said second electrical midpoint, a horizontal feedpoint at said first end joining said first and second horizontal conductor elements.

22. The quadrature coil of claim 21, wherein said first pair of said vertical mode conductor elements are symmetrical with respect to said second pair of vertical mode conductor elements about a horizontal plane including said longitudinal axis.

23. The quadrature coil of claim 21, wherein said first horizontal mode conductor element is symmetrical with respect to said second horizontal mode conductor element about a horizontal plane including said longitudinal axis.

24. The quadrature coil of claim 21, wherein said first pair of vertical mode conductor elements and said first horizontal mode conductor element are disposed above the longitudinal axis, and said second pair of vertical mode conductor elements and said second horizontal mode conductor elements are disposed below the longitudinal axis.

25. The quadrature coil of claim 21, wherein the subject is the head and upper torso region of a patient.

26. The quadrature coil of claim 22, wherein each pair of vertical mode conductor elements includes a first vertical mode conductor element and a second vertical mode conductor element, a vertical mode feedpoint at said first end coupling at least one first vertical mode conductor element to at least one second vertical mode conductor element.

27. The quadrature coil of claim 22, wherein said shell has access ports formed therein between said first horizontal mode conductor element and each of said first pair of vertical mode conductor elements so as to permit access to the subject through said shell.

28. A quadrature coil NMR system, comprising:

a continuous conductor including
first and second vertical mode loops each having a first end, a second end and an electrical midpoint, said first ends of said first and second loops joined together at a first vertical mode feedpoint, said second ends of said first and second loops joined together at a second vertical mode feedpoint; and
first and second horizontal mode conductor elements each having a first end and a second end, said first ends of said horizontal mode conductor elements joined to respective horizontal mode feedpoints, said second ends of said horizontal mode conductor elements joined to respective midpoints of the vertical mode loops;

a receiver coupled to said vertical mode feedpoints and operable, during a vertical mode of operation, to receive a vertical mode electromagnetic signal having a first predetermined magnitude and phase at said vertical mode feedpoints, the voltages at the feedpoints being of equal amplitudes and opposite phases with respect to common ground, such that said midpoints experience voltage nulls;

said receiver coupled to said horizontal mode feedpoints and operable, during a horizontal mode of operation, to receive a horizontal mode electromagnetic signal having a second predetermined magnitude and phase at said horizontal mode feedpoints, the voltages at the feedpoints being of equal amplitudes and opposite phases with respect to common ground, such that said vertical mode feedpoints are electrical midpoints which experience voltage nulls during said horizontal mode of operation of said system; and a means to combine said vertical and horizontal mode signals constructively to achieve quadrature operation.

29. A quadrature coil capable of transmitting and receiving electromagnetic signals for imaging a portion of a patient's anatomy, said quadrature coil comprising:

a continuous conductor including
first and second vertical mode loops each having an electrical midpoint;
a first horizontal mode conductor element having an end joined to the electrical midpoint of the first vertical mode loop; and
a second horizontal mode conductor element having an end joined to the electrical midpoint of the second vertical mode loop; and means for permitting access of at least a portion of the patient into the continuous conductor.

30. The quadrature coil of claim 29 wherein the patient access means includes a shell which carries the first and second vertical mode loops, and the first and second horizontal mode conductor elements, said shell having a central opening for receiving the patient's neck, head and chest to permit imaging of the region substantially defined by the patient's head to the aortic arch.

* * * * *